United States Patent
Ku et al.

(10) Patent No.: US 7,668,010 B2
(45) Date of Patent: Feb. 23, 2010

(54) FLASH MEMORY HAVING INSULATING LINERS BETWEEN SOURCE/DRAIN LINES AND CHANNELS

(75) Inventors: Shaw Hung Ku, Taipei (TW); Ten Hao Yeh, Hsinchu (TW); Shih Chin Lee, Yunlin County (TW); Shang Wei Lin, Kaohsiung (TW); Chia Wei Wu, Jhubei (TW); Tzung Ting Han, Yilan (TW); Ming Shang Chen, Hsinchu (TW); Wenpin Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 178 days.

(21) Appl. No.: 12/038,612

(22) Filed: Feb. 27, 2008

(65) Prior Publication Data

US 2009/0213656 A1  Aug. 27, 2009

(51) Int. Cl.
G11C 16/00 (2006.01)
(52) U.S. Cl. .............................. 365/185.13; 365/185.02; 365/257; 365/314; 365/328
(58) Field of Classification Search ............. 365/185.13
See application file for complete search history.

(56) References Cited

U.S. PATENT DOCUMENTS

| 4,963,502 | A | | 10/1990 | Teng et al. |
| 5,258,634 | A | * | 11/1993 | Yang ........................... 257/316 |
| 5,859,459 | A | * | 1/1999 | Ikeda .......................... 257/374 |
| 5,896,311 | A | * | 4/1999 | Wen ............................ 365/149 |
| 6,368,928 | B1 | | 4/2002 | Wang et al. |
| 6,380,045 | B1 | | 4/2002 | Guo et al. |

(Continued)

FOREIGN PATENT DOCUMENTS

TW    466704    1/2001

(Continued)

OTHER PUBLICATIONS

Park, Youngwoo et al., "Highly Manufacturable 32Gb Multi-Level NAND Flash Memory with 0.0098 μm2 Cell Size Using TANOS (Si-Ocide-Al2O3-TaN) Cell Technology," Electron Devices Meeting, 2006. IEDM '06. International Dec. 11-13, 2006 pp. 1-4.

(Continued)

*Primary Examiner*—Tan T. Nguyen
(74) *Attorney, Agent, or Firm*—Haynes Beffel & Wolfeld LLP

(57) ABSTRACT

A memory array comprises a semiconductor body having a plurality of trenches aligned generally in parallel. The trenches contain semiconductor material, such as doped amorphous silicon, and act as source/drain lines for the memory array. Insulating liners lie between the semiconductor material within the trenches and the semiconductor body. A plurality of word lines overlie the plurality of trenches and channel regions in the semiconductor body in an array of cross points. Charge trapping structures lie between the word lines and the channel regions at the cross points, providing an array of flash memory cells. The charge trapping structures comprise dielectric charge trapping structures adapted to be programmed and erased to store data. A method for manufacturing such devices includes patterning and forming the sources/drain lines with insulating liners prior to formation of the charge trapping structure over the channel regions.

22 Claims, 7 Drawing Sheets

U.S. PATENT DOCUMENTS

| | | | |
|---|---|---|---|
| 6,627,943 B2 * | 9/2003 | Shin et al. | 257/315 |
| 6,812,103 B2 | 11/2004 | Wang et al. | |
| 6,858,505 B2 | 2/2005 | Park | |
| 6,933,565 B2 | 8/2005 | Matsumoto et al. | |
| 7,176,097 B2 | 2/2007 | Hiraizumi et al. | |
| 2008/0296659 A1 * | 12/2008 | Park et al. | 257/324 |

FOREIGN PATENT DOCUMENTS

| | | |
|---|---|---|
| TW | I255553 | 5/2006 |

OTHER PUBLICATIONS

Jurczak, M., et al., "Dielectric pockets—a new concept of the junctions for deca-nanometric CMOS devices," Solid-State Device Research Conference, 2000. Proceedings of the 30th European Sep. 11-13, 2000, pp. 536-539.

Trivedi, V.P., et al., "Nanoscale FD/SOI CMOS: Thick or Thin Box?" IEEE Electron Letters, vol. 26, No. 1, Jan. 2005, 3 pages.

* cited by examiner

FLASH MEMORY HAVING INSULATING LINERS BETWEEN SOURCE/DRAIN LINES AND CHANNELS

BACKGROUND OF THE INVENTION

1. Field of the Invention

The present invention relates to integrated circuit technology including new memory cell structures for flash memory.

2. Description of Related Art

In popular architectures for flash memory, the memory cells are either constructed in series between a bitline and a reference line (e.g. NAND Flash), or connected in parallel between bitlines and reference lines (e.g. NOR or AND Flash). For NAND Flash, 16 or 32 transistors are connected in series, and the reading current passes through all the series connected cells. This greatly reduces the reading current. Typically the read current is smaller than 1 µA, and the read random access time for a single bit can be about 20 µsec.

For NOR and AND Flash, the memory transistors are connected in parallel, so that larger reading current can be provided (typically larger than 20 µA). The larger reading current enables fast random access read applications (typically 70-100 nanoseconds for single bit reading). However, relatively high voltages are used. Thus, as the device sizes become smaller, so-called short channel effects like punch-through become difficult to control.

One technology for controlling the short channel effect is based on "pocket implants" (also called "channel stop implants"), formed by implanting pockets in the channel near the source and drain junctions with higher concentrations of dopants having the same conductivity type as the channel. See, e.g., Matsumoto et al., U.S. Pat. No. 6,933,565, issued 23 Aug. 2005. As the channel lengths of the memory cells shrink the space in the channel available for pocket implants shrinks as well, and pocket implant technology becomes difficult to control precisely.

Another technique which has been explored to control short channel effects is based on the use of dielectric plugs between the source/drain junctions of transistors and the channel of the transistor. See, e.g.; Teng et al., U.S. Pat. No. 4,963,502, issued 16 Oct. 1990; Wang et al., U.S. Pat. No. 6,812,103, issued 2 Nov. 2004; and Park, U.S. Pat. No. 6,858,505, issued 22 Feb. 2005. The dielectric plugs block the electric fields tending to induce short channel effects, effectively enabling devices with smaller channel lengths. However, the dielectric plug techniques involve complex processing techniques, limiting their applicability, and are not believed to have been successfully applied to memory technologies.

Another problem with shrinking memory cells, particularly for NOR Flash architectures, concerns the need for low resistance source and drain terminals, particularly in arrays using doped source/drain lines in the semiconductor substrate (sometimes called "buried diffusion lines") for local bitlines and source lines. As these doped semiconductor lines become narrower and shallower, their resistivity increases. High resistance in the current path for reading the cells can slow down the read cycle, require higher voltage operation, produce waste heat and otherwise affect performance of the device.

It is desirable therefore to provide memory array structures and methods for manufacturing such structures for high speed flash memory devices that are both scalable to small channel lengths, and address issues related to the short channel effect.

SUMMARY OF THE INVENTION

The present invention provides a memory device having low resistance source/drain junctions and spacer insulators surrounding the source/drain junctions to address short channel effects. The memory device is suitable for use in NOR or AND architecture arrays, and such architectures are described. A method for manufacturing such memory devices is also provided, which is readily utilized in memory manufacturing, and supports continuing reduction of critical dimensions as manufacturing technologies advance.

A memory array is described herein that comprises a semiconductor body having a plurality of trenches aligned generally in parallel. The trenches contain semiconductor material, such as doped amorphous silicon, and act as source/drain lines for the memory array. Insulating liners lie between the semiconductor material within the trenches and the semiconductor body. A plurality of word lines overlie the plurality of trenches and channel regions in the semiconductor body in an array of cross points. Charge trapping structures lie between the word lines and the channel regions at the cross points, providing an array of flash memory cells. Memory devices are described having channel lengths between the trenches that are less than 200 nm, including channel lengths less than 100 nm, in a structure scalable to even smaller critical dimensions. The charge trapping structures comprise dielectric charge trapping structures adapted to be programmed and erased to store data.

The memory cells are coupled in parallel between the source/drain lines in a NOR or AND architecture flash memory device in embodiments described herein.

Embodiments are described in which the semiconductor material within the trenches comprises doped amorphous silicon. Also, embodiments are described in which the insulating liners in the trenches comprise sidewall spacers made of a material like a silicon oxide such as silicon dioxide.

The insulating liners implemented, using sidewall spacers or other structures, line the sides of the trenches without extending to the top surface of the semiconductor body in embodiments described herein. Thus, the semiconductor body can be characterized as having a top surface and the trenches are filled by semiconductor material to a height at least approximately level with the top surface of the channel. The insulating liners in the trenches cover sidewalls of the trenches without reaching the top surface of the channel (or being very thin near the top surface), so that a small region near the top surface of the channel is provided in which the semiconductor material within the trenches is in electrical communication with the semiconductor body.

In a large-scale device, global bitlines are provided overlying the plurality of word lines, and block select transistors are arranged to connect the global bitlines to selected source/drain lines in the array. Control circuitry is provided for programming selected memory cells in the array by applying biasing arrangements suited to the particular charge storage structure. For dielectric charge storage structures, control circuitry is provided to apply biasing arrangements that induce electron and/or hole tunneling.

A dielectric charge trapping structure as described herein, suitable for very small channel lengths, includes a tunneling layer, a charge trapping layer and a blocking layer. The tunneling layer comprises a bandgap engineered tunneling layer in embodiments described herein, including a first layer having a hole tunneling barrier height, a second layer having a hole tunneling barrier height less than the first layer, and a third layer having a hole tunneling barrier height greater than that of the second layer.

The method for manufacturing a memory array described herein comprises providing a semiconductor body and forming a plurality of trenches, having sidewalls, and aligned generally parallel in the semiconductor body. The trenches are separated by a ridge of the semiconductor body having a top surface that is less than 200 nm, and more preferably less than 100 nm, wide in embodiments providing for high density memory. Next, insulating liners are formed on the sidewalls of the trenches, using for example a sidewall spacer process involving deposition of the layer of insulating material followed by anisotropic etching. The trenches are then filled over the insulating liners with semiconductor material to act as source/drain lines for the memory array. Next, the process involves forming charge trapping structures on the semiconductor body, at least in regions between the source/drain lines at which memory cells are to be formed. A plurality of word lines are formed overlying the charge trapping structures and generally orthogonal to the source/drain lines, thereby providing memory cells in an array of cross points.

In examples of the process described herein, the trenches are filled with semiconductor material comprising doped amorphous silicon by chemical vapor deposition CVD. In alternative examples, the trenches are filled with undoped, CVD amorphous silicon followed by an implant process to form doped amorphous silicon within the trenches.

The method for manufacturing includes additional process steps to form bitlines, bias circuitry and other structures to complete an integrated circuit device.

As a result, high density NOR or AND architecture flash memory devices can be provided, utilizing dielectric charge trapping memory devices having channel lengths that are less than 200 nm, including devices having channel lengths less than 100 nm.

Other aspects and advantages of the present invention can be seen on review of the drawings, the detailed description and the claims, which follow.

DETAILED DESCRIPTION

A detailed description of embodiments of the present invention is provided with reference to the FIGS. 1-10.

Figure 1:
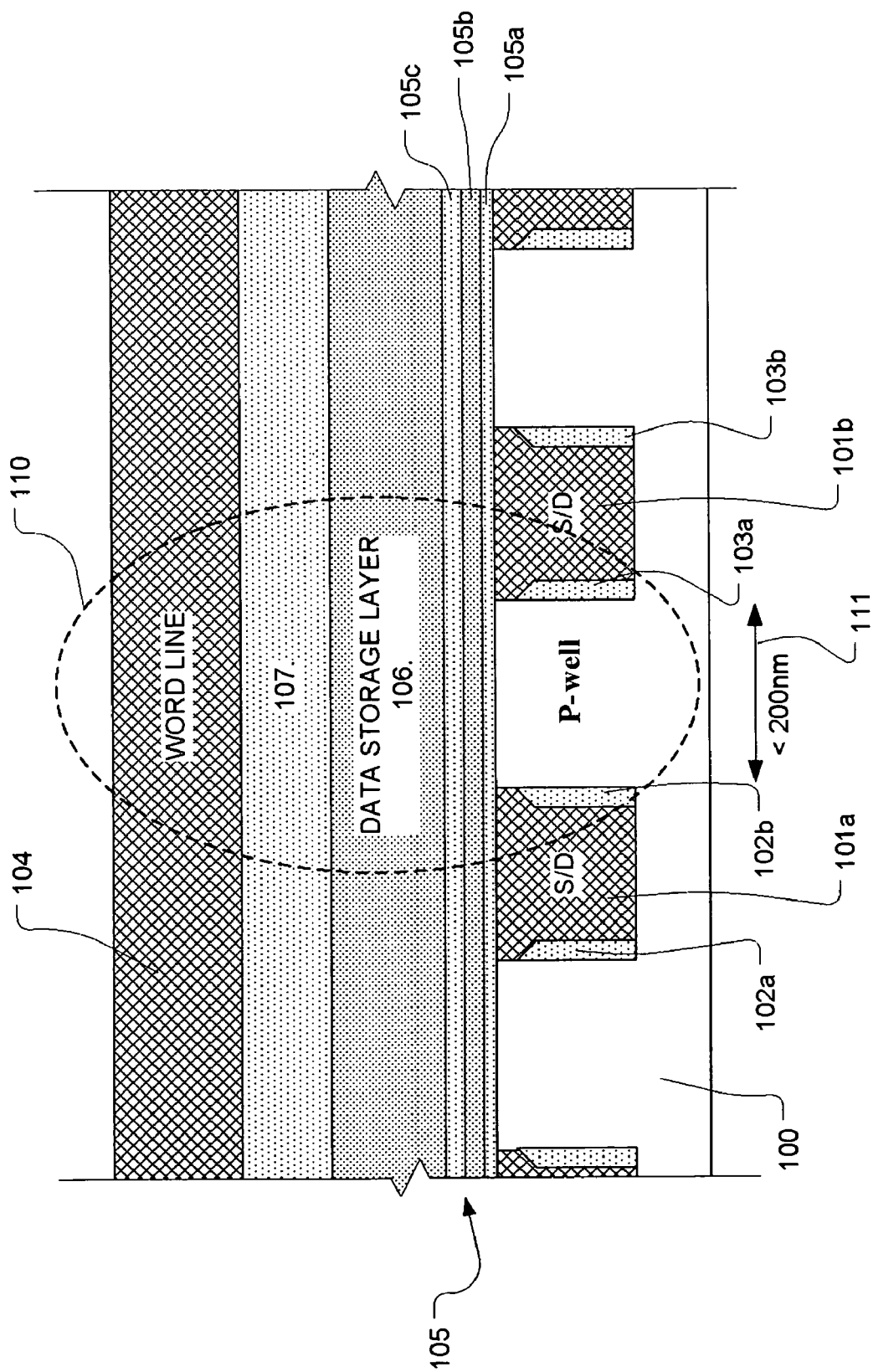
FIG. 1 is a simplified cross-section of a portion of the memory array including memory cells described herein having amorphous silicon trench source/drain lines with insulating liners.

FIG. 1 is a cross-section of the portion of a memory array including source/drain lines implemented using amorphous silicon-filled trenches having insulating sidewalls adjacent the channel regions in the semiconductor body. The illustrated structure includes a semiconductor body 100, implemented using a p-well in an isolated substrate well, for n-channel dielectric charge trapping devices. Of course, n-well technology would be used for p-channel devices. A plurality of trenches 101a, 101b in the semiconductor body 100 are arranged in parallel along lines orthogonal to the page in FIG. 1. The trenches 101a, 101b are filled with doped amorphous silicon to provide source/drain lines, also called local bitlines, for the memory array. Other semiconductor materials and other forms of silicon may be used, such as polysilicon, epitaxial silicon, and germanium and so on. Insulating liners 102a and 102b are interposed between the semiconductor body and the doped amorphous silicon within the trench 101a along the sidewalls of the trench 101a. Likewise, insulating liners 103a and 103b are interposed between the semiconductor body and the doped amorphous silicon within the trench 101b along the sidewalls of the trench 101b. A word line 104 overlies the amorphous silicon filled trenches and is arranged generally orthogonal relative to the trenches. A charge storage structure is implemented between word line 104 and the semiconductor body 100. The charge storage structure includes a tunneling dielectric layer 105 on the semiconductor body which, in the illustrated embodiment, comprises a bandgap engineered, multilayer structure including layers 105a, 105b, and 105c. A charge storage layer 106 lies on the tunneling layer 105. A blocking dielectric layer 107 lies between a charge storage layer 106 and the word line 104.

At cross points of the word line 104 and channel regions in the semiconductor body, between the amorphous silicon filled trenches (e.g. 101a and 101b), memory cells are formed, such as memory cell 110, where the word line 104 acts as the gate, the charge storage structure including layers 105, 106 and 107 acts to store charge in order to establish a threshold for the memory cell, and the amorphous silicon filled trenches 101a and 101b act as the source and drain.

As illustrated, the insulating liners (e.g. liner 102b) line portions of the sidewall of the amorphous silicon filled trenches. In the illustrated embodiment, the channel region of the semiconductor body has a top surface in contact with the tunneling layer 105. The amorphous silicon filled trench is filled with amorphous silicon up to a level that is coplanar or nearly co-planner with the top surface of the channel region. The insulating liner does not reach all the way to the top surface of the channel, leaving a region allowing electrical connection between the amorphous silicon filled trench and the channel. However, the insulating liner serves to block the electric field between the source/drain lines and channel deeper in the semiconductor body that otherwise tends to cause short channel effects. It is found that the insulating liners provide substantial improvement in performance of the memory cells when the channel length 111 (length of the semiconductor body between the amorphous silicon filled trenches) is less than 200 nm. In preferred embodiments, the channel length 111 is less than 100 nm. Embodiments can be implemented using a variety of current advanced patterning technologies having channel lengths of 50 nm or less, including for example high numerical aperture, immersion photolithography.

The charge trapping structure in the illustrated embodiment (not to scale) comprises a bandgap engineered tunneling layer 105 including a first layer 105a of silicon dioxide less than 2 nm thick (such as about 13 Å), a second layer 105b of silicon nitride less than 2.5 nm thick (such as about 20 Å), a third layer 105c of silicon dioxide less than 3 nm thick (such as about 25 Å). In alternative embodiments, the tunneling layer 105 may comprise a single layer of material, such as silicon dioxide or silicon oxynitride having a thickness of 2 to 4 nm. The charge storage layer 106 comprises silicon nitride, in this example greater than 5 nm thick (such as about 70 Å), or other charge trapping dielectric material, and the blocking layer 107 comprises silicon dioxide, in this example greater than 5 nm thick (such as about 90 Å). Alternative embodiments using a multilayer blocking layer, or a high dielectric constant material like $Al_2O_3$, can be implemented. Also, the word line may comprise p-type or n-type polysilicon. A higher work function material may be used in addition to or in place of the polysilicon in contact with the blocking layer 107, or, such as tantalum, titanium, platinum, tantalum nitride, titanium nitride and so on.

Figure 2:
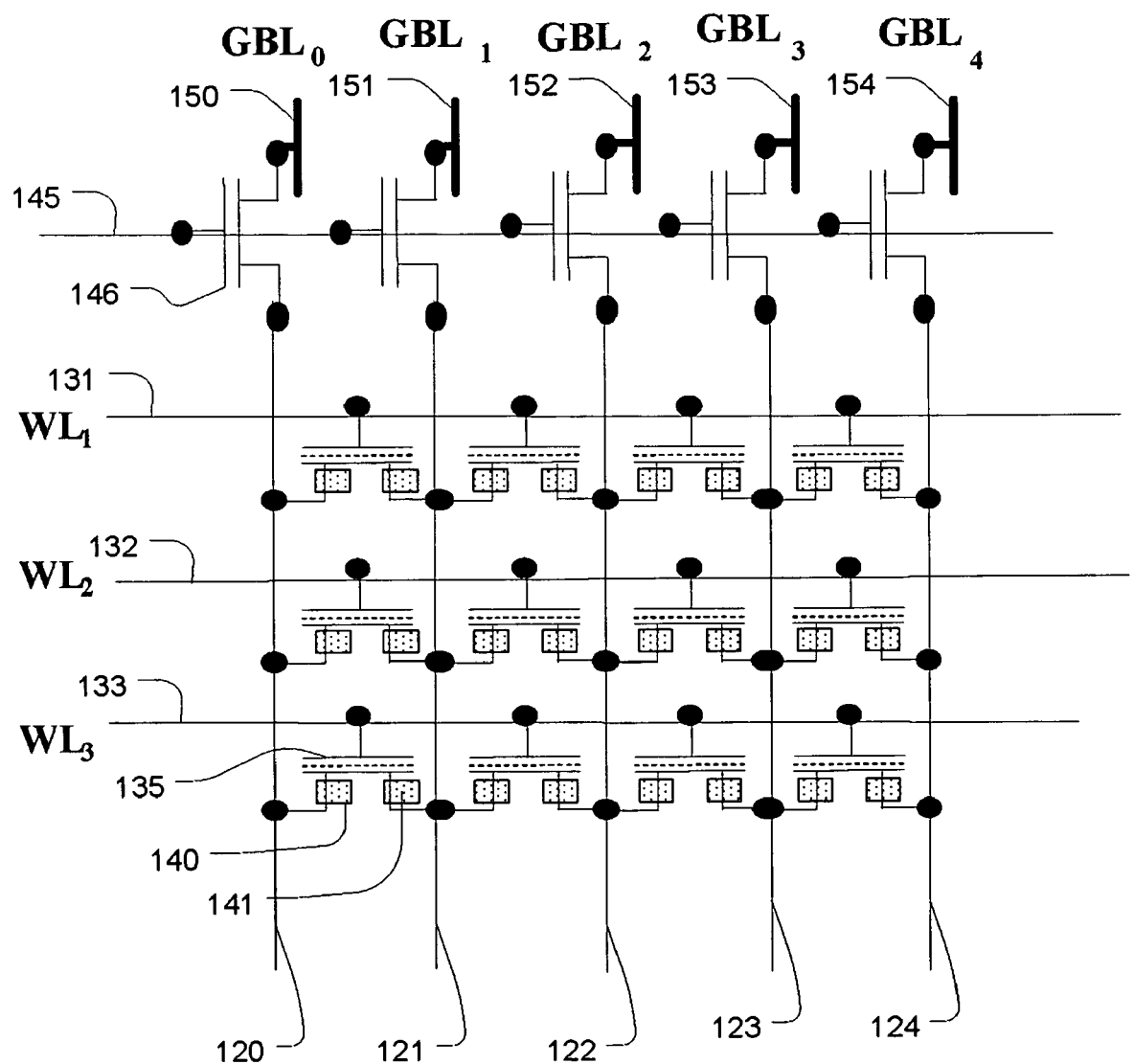
FIG. 2 is a simplified schematic diagram of a NOR architecture flash memory device including memory cells as described herein.

FIG. 2 is a simplified schematic diagram of a NOR or AND architecture memory array using memory cells such as described with reference to FIG. 1. Representative memory cell 135 is shown using a standard symbol for a charge trapping memory cell with blocks 140 and 141 representing the insulating liners in the amorphous silicon source/drain lines as described above. As can be seen, local bitlines 120, 121, 122, 123, 124 (implemented using doped amorphous silicon filled trenches as described above) are arranged generally in parallel. Word lines 131, 132, 133 are orthogonal to the local bitlines. Block select transistors, such as transistor 146 are arranged to connect the local bitlines, such as local bitline 120, to global bitlines (150-154) such as global bitline 150, in response to block select signals on line 145. A similar block select transistor (not shown) is arranged at the opposite end of the local bitline in typical embodiments, allowing each local bitline to act as source or drain for accessing selected cells. A given memory cell (e.g. cell 135) is accessed by applying a voltage to the word line coupled to its gate (e.g. word line 133), coupling the local bitline (e.g. local bitline 120) on one side to a sense amplifier, and coupling the local bitline (e.g. local bitline 121) to the source potential used during the access operation. As illustrated in the example array, the memory cells are arranged in parallel between local bitlines.

Figure 3:
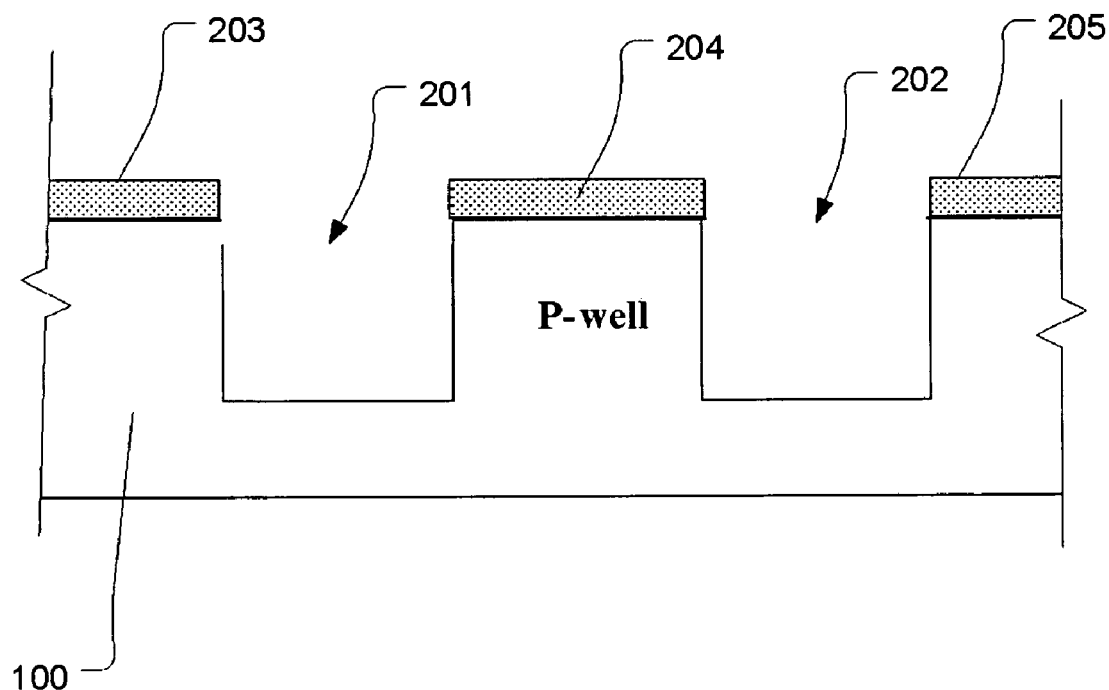
FIG. 3 is a simplified cross-section showing a stage in a manufacturing process described herein for high density flash memory cells.

FIGS. 3-6 illustrate stages in a manufacturing process for a memory array as described with reference to FIGS. 1 and 2. As can be seen in FIG. 3, trenches 201, 202 are formed in the semiconductor body 100 using etch masks 203, 204, 205. The etch masks 203, 204, 205 comprise narrow strips of material selected so that they have substantially different etch characteristics than the semiconductor body 100. The narrow strips are patterned using lithographic techniques or other techniques used for forming narrow lines (less than 100 nm, and more preferably 50 nm or less) on the semiconductor body. When the semiconductor body 100 is silicon, a suitable etch mask comprises silicon nitride having a thickness of about 50 nm. Using the etch masks, the trenches 201, 202 are etched into the semiconductor body using reactive ion etching or similar techniques that provide relatively vertical sidewalls on the trenches. The depth of the trenches and the width of the trenches are selected in order to provide sufficient cross-section to implement sources/drain lines having relatively low resistance, and lie in a range of about 100 nm to 150 nm in representative high density devices. For example, for an embodiment in which the channel length is about 100 nm, the width of the trench 201 can be about 100 nm, and the depth of the trench 201 can be about 120 nm.

Figure 4:
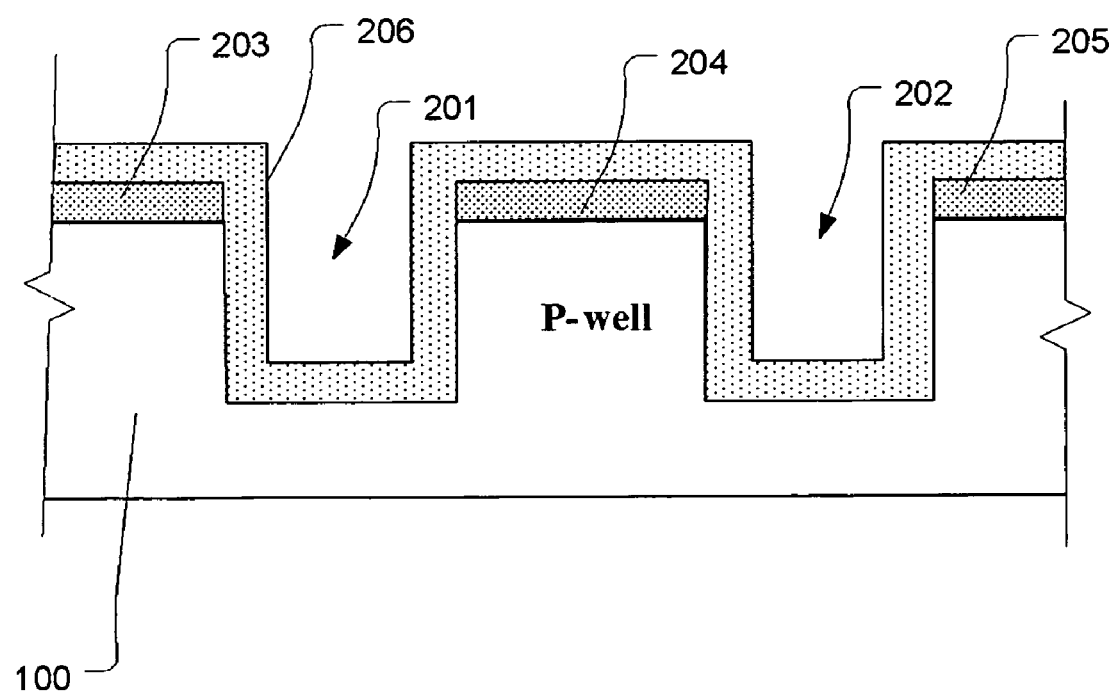
FIG. 4 is a simplified cross-section showing a second stage in the manufacturing process described herein for high density flash memory cells.

As illustrated in FIG. 4, a layer 206 of insulating liner material such as silicon dioxide is deposited which is at least relatively conformal over the etch masks 203, 204, 205 and the surfaces of the trenches 201, 202, so that the thickness on the sidewalls is close to the thickness on the top of the etch masks and in the bottom of the trenches. When silicon dioxide is used as the insulating liner, a TEOS deposition process can be utilized to form the layer 206 from 5 to 10 nm thick, for example.

Figure 5:
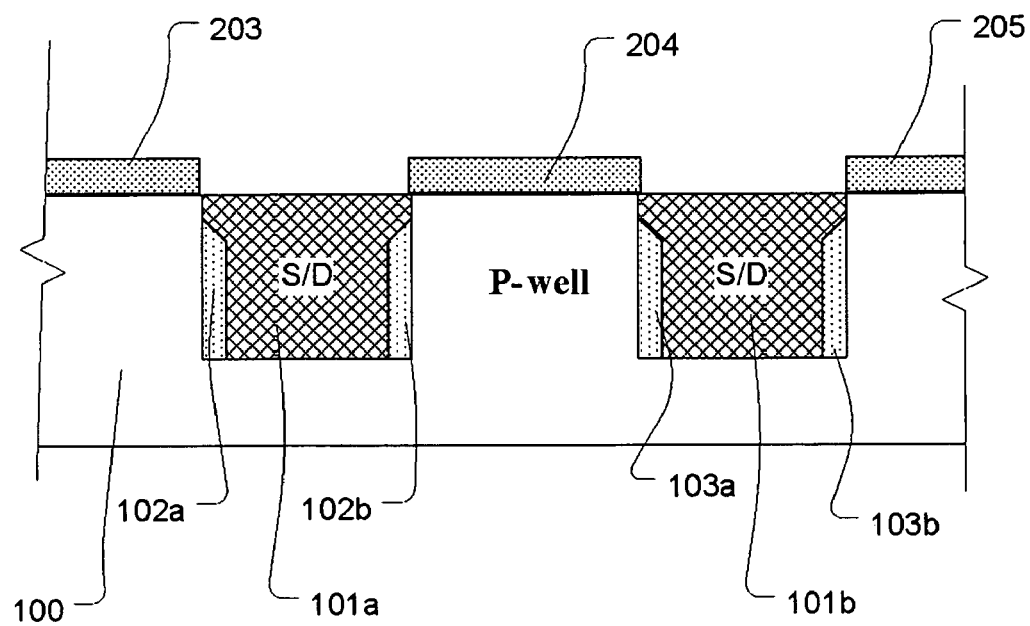
FIG. 5 is a simplified cross-section showing a third stage in the manufacturing process described herein for high density flash memory cells.

FIG. 5 illustrates another stage in the manufacturing process after anisotropically etching the layer 206 to leave sidewall structures acting as insulating liners 102a, 102b in the trench 201 and insulating liners 103a, 103b in the trench 202. The etching process is tuned so that the insulating liners are relatively thick (e.g. 80 to 100 nm) near the bottom of the trenches and very thin (e.g. between zero and 5 nm) near the top of the trenches. Preferably, very little oxide is left in the region near the top surface the trenches allowing electrical communication between the channel and the amorphous silicon filled trenches. However, the high concentration of dopants in the amorphous silicon filled trenches will diffuse through a thin oxide layer which may be left near the top surface, allowing conduction between the channel and the source/drain lines. After formation of the insulating liners, doped amorphous silicon is deposited within the trenches and over the structure, either using as-deposited doped amorphous silicon, or using a two-step process in which undoped amorphous silicon is deposited and later implanted with appropriate doping concentrations. After deposition of the doped amorphous silicon, a chemical mechanical polishing process, or other suitable process, is executed to planarize the structure. The planarization process may leave the silicon nitride etch masks 203, 204, 205 in place as illustrated in FIG. 5.

Figure 6:
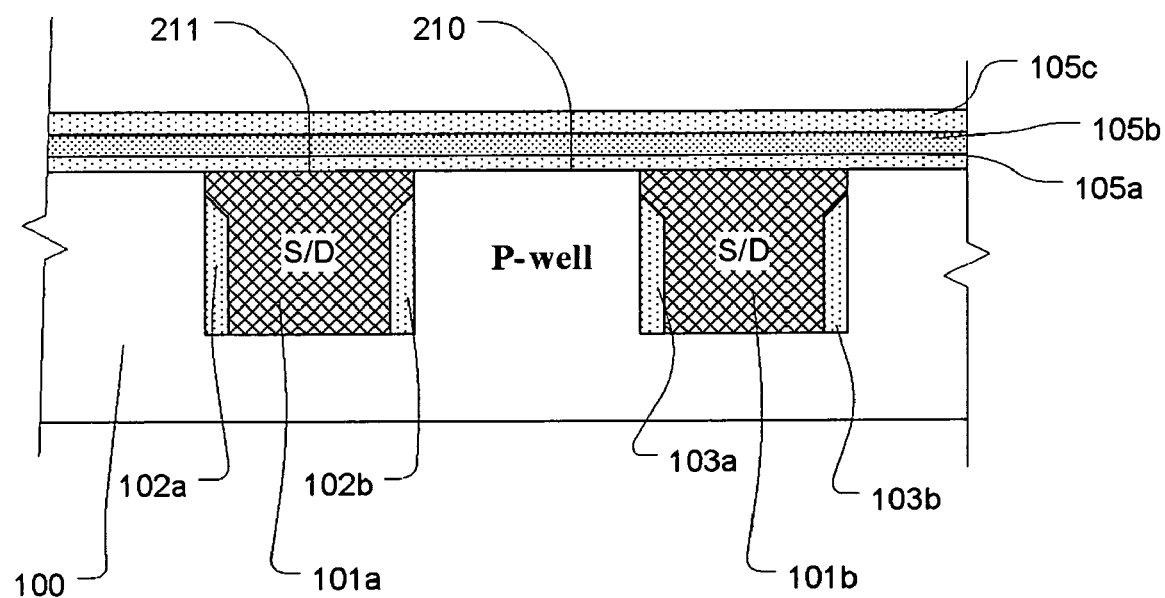
FIG. 6 is a simplified cross-section showing a fourth stage in the manufacturing process described herein for high density flash memory cells.

FIG. 6 illustrates the structure after removal of the masks 203, 204, 205 and formation of the tunneling layer 105. In the illustrated embodiment, the top surface 210 of the channel in the semiconductor body and the top surface 211 of the amorphous silicon filled trenches are coplanar or substantially coplanar. In some embodiments, the top surface 210 of the channel may be raised slightly or recessed slightly relative to the top surface of the amorphous silicon filled trenches. After removal of the masks, a multilayer tunneling structure is implemented in the illustrated embodiment, including a bottom layer 105a of silicon dioxide having a thickness less than 15 Angstroms, such as 13 Angstroms or 10 Angstroms. Next, layer 105b of silicon nitride is formed on the layer 105a. The silicon nitride layer 105b has a thickness less than 3 nm, and preferably less than 2.5 nm. A top layer 105c of the tunneling layer comprises silicon dioxide having a thickness less than 3.5 nm, and preferably less than 3 nm.

The manufacturing process continues by depositing a charge storage layer, such as a layer of silicon nitride at a thickness of about 7 nm, and a blocking dielectric layer, such as a layer of silicon dioxide or aluminum oxide having an effective oxide thickness of about 7 to 9 nm. Finally, word lines are formed in a pattern over the array as described above with reference to FIG. 1. In addition, interlayer dielectrics are formed over the word line layer, and global bitlines are formed. As mentioned with respect to FIG. 2, block select transistors are implemented on the device adapted for connecting selected local bitlines formed by the amorphous silicon filled trenches to the global bitlines.

Figure 7:
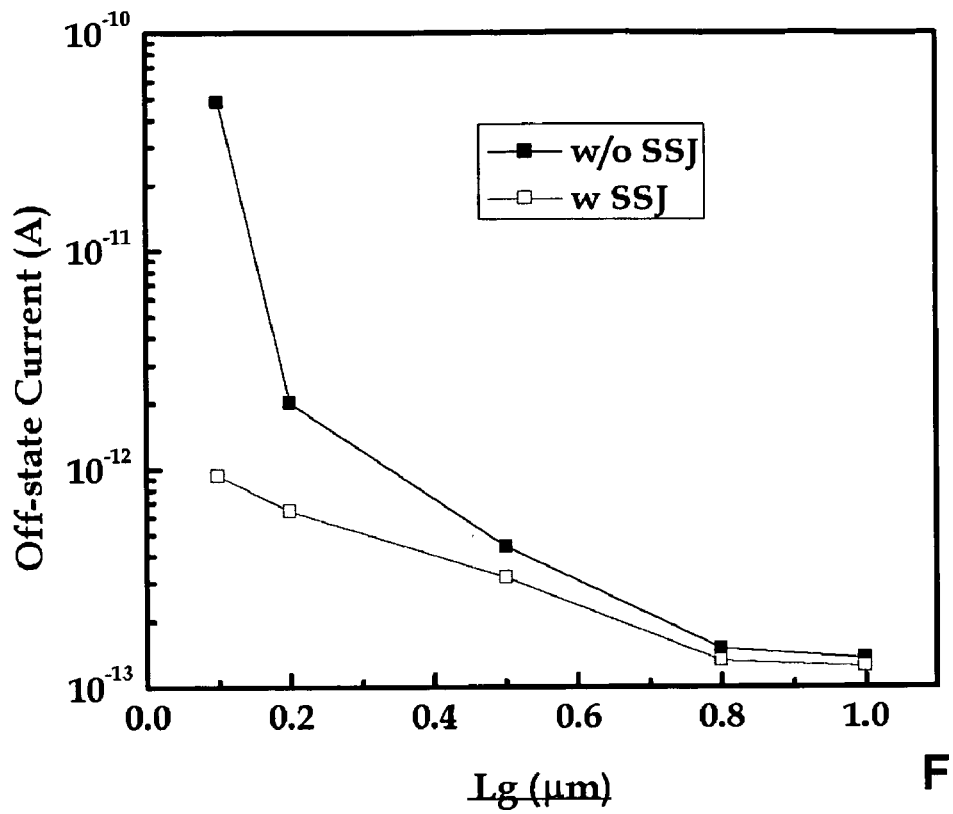
FIG. 7 is a graph of off state current versus gate length for memory with and without amorphous silicon trench source/drain lines with insulating liners.
Figure 8:
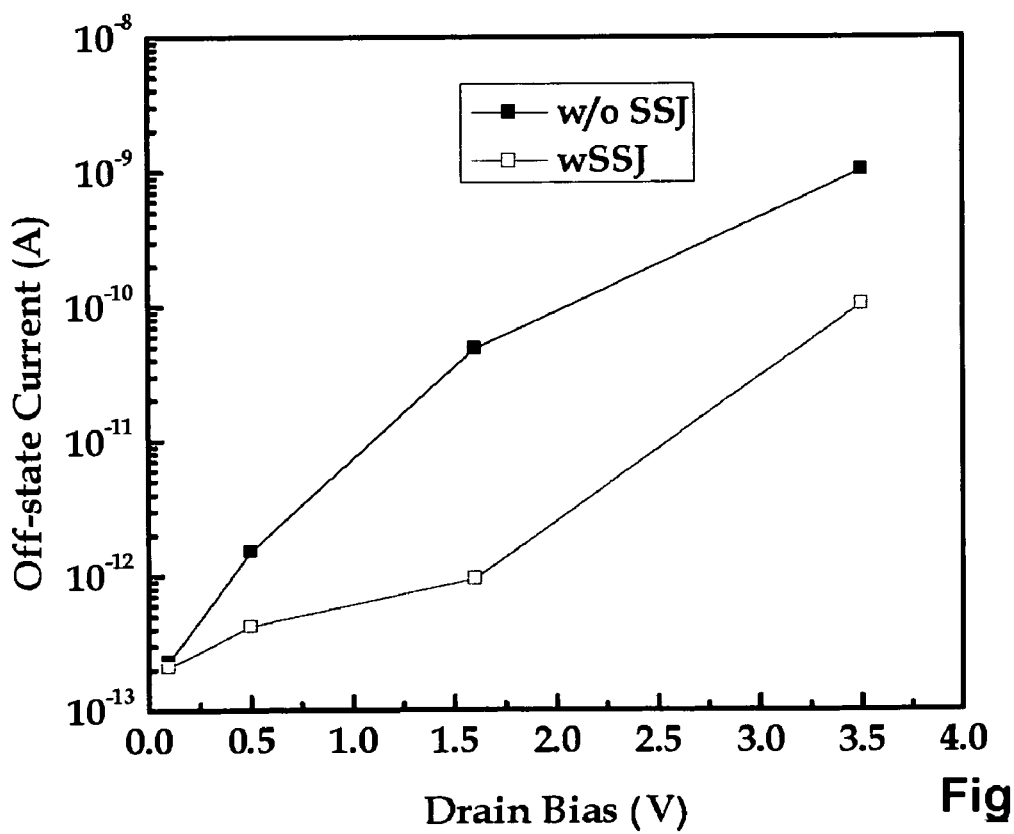
FIG. 8 is a graph of off state current versus drain bias for memory cells with and without amorphous silicon trench source/drain lines with insulating liners.

FIG. 7 and FIG. 8 are graphs showing the results of simulations showing performance enhancement provided by the structure shown in FIG. 1 with the insulating liner that forms a spacer surrounding the junction (labeled "w SSJ"), compared to a similar device without the insulating liner (labeled "w/o SSJ"). FIG. 7 is a graph of the gate length Lg in microns (which is the same as channel length in FIG. 1) versus current in the off state for the device. As can be seen, as the gate length falls below about 0.8μ, the off state current for a memory cell having the insulating liner as described above begins to fall below that of a corresponding device without the insulating liner. At the gate length of about 0.2μ (200 nm), substantial improvement in off state current begins to occur. As can be seen at about 100 nm, the off state current for a device having the insulating liners as described above is almost two orders of magnitude lower than that of corresponding devices without the insulating liners. For preferred devices having channel lengths of about 50 nm or less, similar performance improvement is expected.

Figure 9:
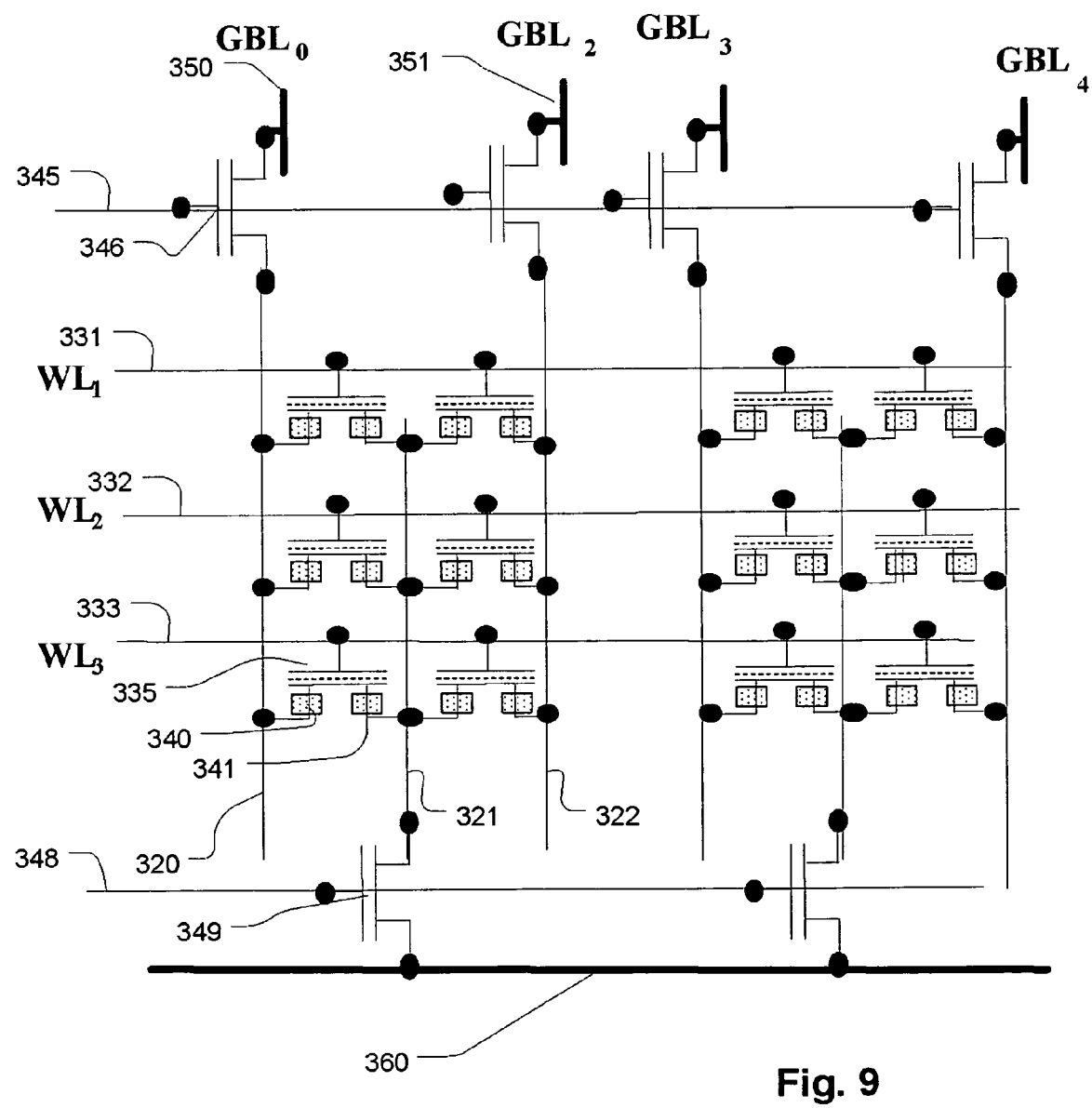
FIG. 9 is a simplified schematic diagram of an alternative architecture flash memory device including memory cells as described herein.

FIG. 8 is a graph of drain bias voltage versus off state current for a representative cell having a gate length of about 0.1μ (100 nm). As illustrated, when the device is biased below threshold, the off state current for a drain bias in a typical operating range for a NOR or AND architecture device between about 1.5 and 3.5 V is much lower for memory cells implemented with insulating liners than without. The FIG. 9 is a simplified diagram of an alternative AND or NOR architecture including memory cells such as described with reference to FIG. 1. Representative memory cell 335 is shown using the standard symbol for a charge trapping memory cell with blocks 340 and 341 representing the insulating liners in the amorphous silicon source/drain lines as described above. As can be seen, local bitlines 320, 321, 322 implemented using doped amorphous silicon filled trenches as described above are arranged generally in parallel, and in a drain/source/drain configuration. Specifically, local bitline 320 and local bitline 322 are arranged as drain lines coupled through block select transistors, such as transistor 346 to global bitlines at 350, 351. Local bitline 321 is arranged as a source line, and is coupled through a source select transistor 349 to a source line 360. Word lines 331, 332, 333 are orthogonal to the local bitlines. Block select transistors, such as transistor 346 are arranged to connect the local bitlines, such as local bitline 320, to global bitlines such as global bitline 350, in response to block select signals on line 345. A similar block select transistor 349 is arranged at the opposite end of the local bitline 321 for connection of the local bitline arranged as a source line to a source reference line 360, in response to source select signals on line 348. A given memory cell (e.g. cell 335) is accessed by applying a voltage to the word line coupled to its gate (e.g. word line 333), coupling the local bitline (e.g. local bitline 320) on one side to a sense amplifier, and coupling the local bitline (e.g. local bitline 321) to the source potential used during the access operation. As illustrated in the example array, the memory cells are arranged in parallel between local bitlines.

Figure 10:
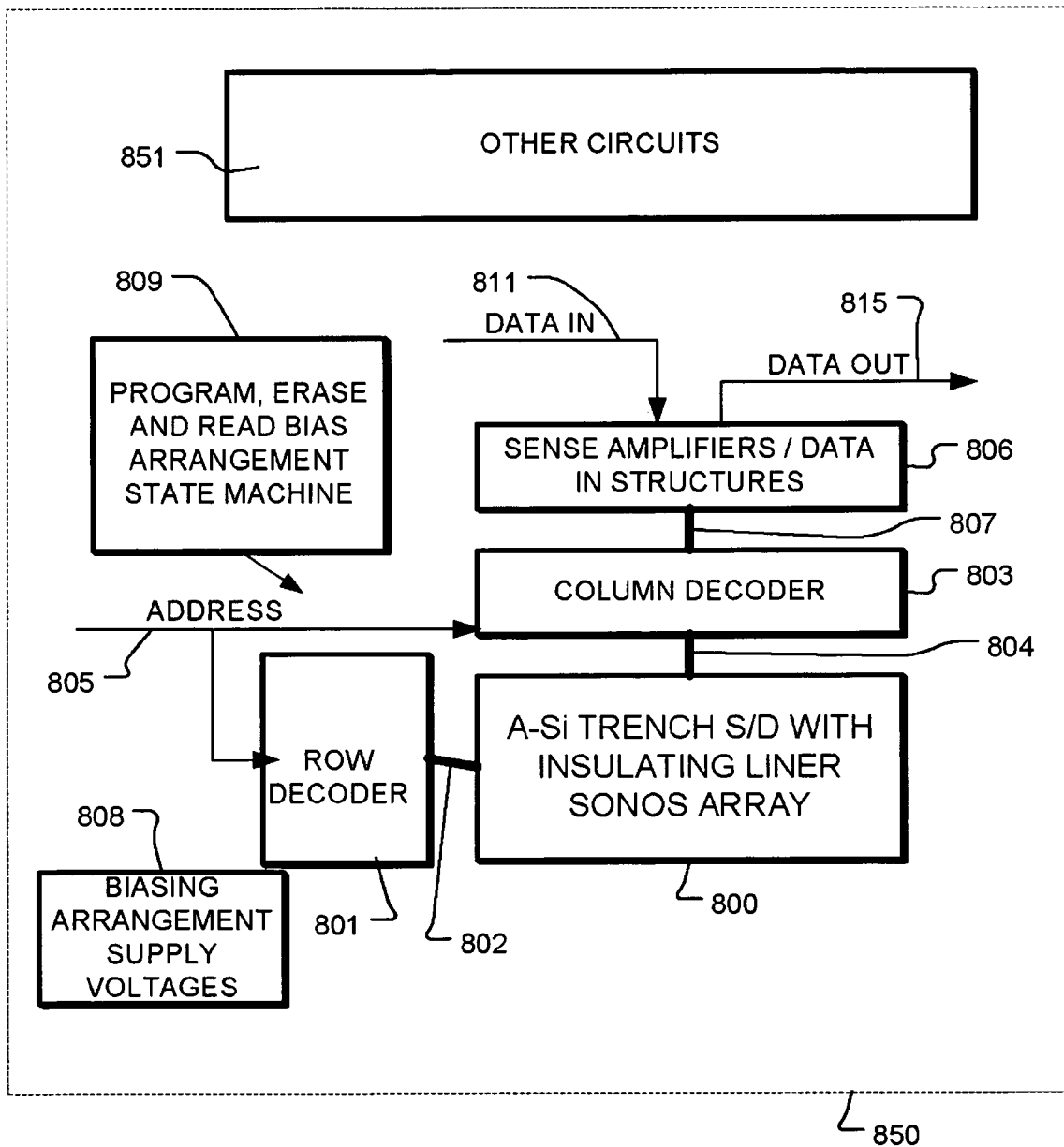
FIG. 10 is a simplified block diagram of an integrated circuit including a memory array comprising dielectric charge storage flash memory cells having amorphous silicon trench source/drain lines with insulating liners.

FIG. 10 is a simplified block diagram of an integrated circuit 850 employing a NOR array 800, the memory cells as described herein having low resistance source/drain junctions and insulating liners surrounding the source/drain junctions to address short channel effects. A word line (or row) and block select decoder 801 is coupled to, and in electrical communication with, a plurality 802 of word lines and block select lines, and arranged along rows in the memory array 800. A bitline (column) decoder and drivers 803 are coupled to and in electrical communication with a plurality of bitlines 804 arranged along columns in the memory array 800 for reading data from, and writing data to, the memory cells in the memory array 800. Addresses are supplied on bus 805 to the word line decoder and drivers 801 and to the bitline decoder 803. Sense amplifiers and data-in structures in block 806, including current and voltage sources for the read, program and erase modes, are coupled to the bitline decoder 803 via data bus 807. Data is supplied via the data-in line 811 from input/output ports on the integrated circuit 850 or from other data circuits 851 internal to the integrated circuit to the data-in structures in block 806. In the illustrated embodiment, other circuitry 851 is included on the integrated circuit 850, such as a general purpose processor or special purpose application circuitry, or a combination of modules providing system-on-a-chip functionality supported by the memory cell array. Data is supplied via the data-out line 815 from the sense amplifiers in block 806 to input/output ports on the integrated circuit 850, or to other data destinations internal or external to the integrated circuit 850.

The array 800 can have NOR or AND array architectures as described above, or other array structures, depending on the particular application and structures of the memory cells used.

A controller 809 implemented in this example, using a bias arrangement state machine, controls the application of bias arrangement supply voltages and current sources 808, such as read, program, erase, erase verify, program verify voltages or currents for the word lines and bitlines, and controls the word line/source line operation using an access control process. The controller 809 can be implemented using special purpose logic circuitry as known in the art. In alternative embodiments, the controller 809 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 809.

Accordingly, an integrated circuit memory device is described that includes high density flash memory. Insulating liners are implemented between conductive source/drain lines and the channel regions of the memory cells which suppress the electric field fringing effect in the semiconductor body and help control short channel effects. The resulting devices have good sub-threshold swing parameters, low resistance junctions and can be implemented without channel stop pocket implants. The memory cells are particularly useful in memory array architectures, such as NOR or AND architecture devices, in which relatively high drain biases are applied, aggravating short channel effects.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory array, comprising:
   a semiconductor body;
   a plurality of trenches aligned generally in parallel in the semiconductor body, said trenches containing semiconductor material having a first conductivity type acting as source/drain lines for the memory array, and having insulating liners between the semiconductor material and the semiconductor body;

a plurality of word lines overlying the plurality of trenches and channel regions in the semiconductor body between corresponding pairs of trenches in an array of cross points; and charge trapping structures between the word lines and the semiconductor body forming memory cells at the cross points, the memory cells connected in parallel between first and second trenches, the charge trapping structures adapted to be programmed and erased to store data.

2. The memory array of claim 1, wherein the semiconductor material within the trenches comprises doped amorphous silicon.

3. The memory array of claim 1, wherein insulating liners in the trenches comprise a silicon oxide.

4. The memory array of claim 1, wherein the semiconductor body has a top surface, and the semiconductor material fills the trenches to a height at least approximately level with the top surface, and the insulating liners in the trenches cover at least portions of sidewalls of the trenches.

5. The memory array of claim 1, including global bitlines overlying the plurality of word lines, and block select transistors arranged to connect the global bitlines to selected source/drain lines.

6. The memory array of claim 1, including control circuitry for programming selected memory cells in the array by applying biasing arrangements to selected cells that induce tunneling of electrons, and for erasing selected memory cells in the array, by applying biasing arrangements to selected cells that induce tunneling of holes.

7. The memory array of claim 1, wherein the charge trapping structure comprises a tunneling layer, a charge trapping layer and a blocking layer.

8. The memory array of claim 1, wherein the charge trapping structure comprises a tunneling layer, a dielectric charge trapping layer and a dielectric blocking layer, the tunneling layer including a first layer having a hole tunneling barrier height, a second layer having a hole tunneling barrier height less than the first layer, and a third layer having hole tunneling barrier height greater than that of the second layer.

9. The memory array of claim 1, wherein said trenches are separated by less than 200 nm, providing memory cells having channel lengths less than 200 nm.

10. The memory array of claim 1, wherein said trenches have depths in a range of about 100 to 150 nm.

11. A method for manufacturing a memory array, comprising:

providing a semiconductor body;

forming a plurality of trenches aligned generally in parallel in the semiconductor body, said trenches having sidewalls;

forming insulating liners on said sidewalls of the trenches;

filling the trenches over the insulating liners with semiconductor material to act as source/drain lines for the memory array;

forming charge trapping structures on the semiconductor body, at least in regions between the source/drain lines;

forming a plurality of word lines overlying the charge trapping structures, and generally orthogonal to the source/drain lines, thereby providing memory cells in an array of cross points between corresponding pairs of source/drain lines.

12. The method of claim 11, wherein the semiconductor material used for filling the trenches comprises doped amorphous silicon.

13. The method of claim 11, wherein the semiconductor material used for filling the trenches comprises amorphous silicon, and includes implanting dopants into the amorphous silicon.

14. The method of claim 11, wherein insulating liners in the trenches comprise a silicon oxide.

15. The method of claim 11, wherein the semiconductor body has a top surface, and the trenches have sidewalls and are filled with the semiconductor material to a height at least extending to the top surface of the channel.

16. The method of claim 11, wherein said forming insulating liners includes depositing a layer of insulating material over the plurality of trenches, and anisotropically etching the layer of insulating material to form spacers in the trenches covering portions of the sidewalls of the trenches.

17. The method of claim 11, including forming global bitlines overlying the plurality of word lines, and block select transistors arranged to connect the global bitlines to selected source/drain lines.

18. The method of claim 11, including integrating control circuitry with the array of memory cells for programming selected memory cells in the array by applying biasing arrangements to selected cells that induce Fowler-Nordhiem tunneling of electrons, and for erasing selected memory cells in the array, by applying biasing arrangements to selected cells that induce Fowler-Nordhiem tunneling of holes.

19. The method of claim 11, wherein said forming a charge trapping structure comprises forming a tunneling layer on the semiconductor body, forming a dielectric charge trapping layer on the tunneling layer, and forming a blocking layer on the charge trapping layer.

20. The method of claim 11, wherein said forming a charge trapping structure comprises forming a tunneling layer on the semiconductor body, forming a dielectric charge trapping layer on the tunneling layer, and forming a blocking layer on the charge trapping layer, the tunneling layer including a first layer having a hole tunneling barrier height, a second layer having a hole tunneling barrier height less than the first layer, and a third layer having hole tunneling barrier height greater than that of the second layer.

21. The method of claim 11, wherein said forming a plurality of trenches includes forming etch masks on the semiconductor body defining a plurality of lines having widths less than 200 nm, and etching the plurality of trenches using the etch masks.

22. The method of claim 11, wherein said forming a plurality of trenches includes etching said plurality of trenches to depths in a range of about 100 nm to 150 nm.

* * * * *